United States Patent
Toda

Patent Number: 5,894,281
Date of Patent: Apr. 13, 1999

[54] DIGITAL-TO-ANALOG CONVERTER UTILIZING MOS TRANSISTOR SWITCHING CIRCUIT WITH ACCOMPANYING DUMMY GATES TO SET SAME EFFECTIVE GATE CAPACITANCE

[75] Inventor: Akihiko Toda, Hamamatsu, Japan

[73] Assignee: Yamaha Corporation, Hamamatsu, Japan

[21] Appl. No.: 08/891,121

[22] Filed: Jul. 10, 1997

[30] Foreign Application Priority Data

Jul. 11, 1996 [JP] Japan ................... 8-182571

[51] Int. Cl.$^6$ ................... H03M 1/66
[52] U.S. Cl. ................... 341/154; 341/172
[58] Field of Search ................... 341/118, 120, 341/144, 154, 172, 133

[56] References Cited

U.S. PATENT DOCUMENTS

| | | | |
|---|---|---|---|
| 4,055,773 | 10/1977 | Schoeff | 341/899 |
| 4,384,274 | 5/1983 | Mao | 341/136 |
| 4,551,709 | 11/1985 | Merchant et al. | 340/347 |
| 4,752,703 | 6/1988 | Lin | 307/572 |
| 4,833,473 | 5/1989 | Dingwall | 341/154 |
| 4,942,397 | 7/1990 | Real | 341/118 |
| 5,008,671 | 4/1991 | Tuthill | 341/154 |
| 5,446,457 | 8/1995 | Ryat | 341/136 |
| 5,455,582 | 10/1995 | Valdenaire | 341/154 |
| 5,463,394 | 10/1995 | Sun | 341/136 |
| 5,684,481 | 11/1997 | Ashe | 341/139 |

*Primary Examiner*—Marc S. Hoff
*Assistant Examiner*—Peguy JeanPierre
*Attorney, Agent, or Firm*—Pillsbury Madison & Sutro LLP

[57] ABSTRACT

A digital-to-analog (D/A) converter provides superior linearity and reduces glitches by setting optimum dimensions for MOS transistors. The D/A converter is configured from a R-2R ladder circuit and a switching circuit. The R-2R ladder circuit consists of series resistors (R) and shunt resistors (2R), which are connected together at respective nodes corresponding to the bit stages. The switching circuit is configured from MOS transistors which are connected between reference potentials and the shunt resistors for each bit stage. The width/length (W/L) ratios of the MOS transistors are set such that the on-resistances of the transistors are sequentially increased by a factor of 2 in bit-stage descending order from the most significant bit (MSB) to the least significant bit (LSB) to maintain the linearity of the R-2R ladder circuit. Dummy gates are provided in parallel to the MOS transistors, except for the MOS transistors which correspond to the MSB, so that the same effective gate capacitance is set for each bit stage to provide uniform switching speed for each stage avoiding the occurrence of glitches.

7 Claims, 5 Drawing Sheets

(r4=r5=r)

($r3=\frac{1}{2}r$)

($r2=\frac{1}{4}r$)

DIGITAL-TO-ANALOG CONVERTER UTILIZING MOS TRANSISTOR SWITCHING CIRCUIT WITH ACCOMPANYING DUMMY GATES TO SET SAME EFFECTIVE GATE CAPACITANCE

BACKGROUND OF THE INVENTION

This invention relates to digital-to-analog converters which use R-2R ladder circuits (or R/2R ladder network).

FIG. 5 shows an example of a digital-to-analog converter (simply, a D/A converter) which is used in semiconductor LSI circuits (where 'LSI' is an abbreviation for 'Large Scale Integration'). The D/A converter of FIG. 5 is configured using a R-2R ladder circuit 1 which contains series resistors (R) and shunt resistors (2R). The D/A converter of FIG. 5 is designed as a 4-bit converter. A node of a series resistor R corresponding to a most significant bit (MSB) provides an analog output Aout. The series resistors 2R are connected to terminals (or nodes) N1 to N4 respectively. Connections of the terminals N1 to N4 are switched over by a switch-over circuit 2 such that the terminals N1 to N4 are connected to a positive potential terminal of a first reference potential Vref(+) or a negative potential terminal of a second reference potential Vref(−). The switch-over circuit 2 is controlled by bits IN1 to IN4 of a 4-bit digital input. Herein, IN4 denotes the most significant bit (MSB), while IN1 denotes the least significant bit (LSB).

The switch-over circuit 2 is configured by MOS transistors Q11 to Q41, which are connected between the terminals N1 to N4 and the positive potential terminal of Vref(+), as well as MOS transistors Q12 to Q42, which are connected between the terminals N1 to N4 and the negative potential terminal of Vref(−), wherein 'MOS' is an abbreviation for 'Metal-Oxide Semiconductor'. All of the MOS transistors are configured as n-channel MOS transistors of the enhancement type. There are provided two stages of inverters, i.e., I11 to I41 and I12 to I42. Those inverters receive the bits IN1 to IN4 respectively to produce signals which are in reverse phases to each other. The signals selectively switch on or off the MOS transistors.

A node of the series resistor R corresponding to the LSB is connected to the negative potential terminal of Vref(−) via a resistor 2R. To obtain a balance of resistance in consideration of the ON-resistances of the MOS transistors Q11 and Q12, a n-channel MOS transistor Q5 is provided between the resistor 2R and the negative potential terminal of Vref(−). Herein, the n-channel MOS transistor Q5 is normally biased in an ON state.

The operating principle of the D/A converter is well known. An analog output voltage Aout is obtained in accordance with an equation as follows:

$$Aout = \{(1/2)IN4 + (1/4)IN3 + (1/8)IN2 + (1/16)IN1\} \times (Vref(+) - Vref(-))$$

Depending on the construction of the circuit elements, the resistors of the R-2R ladder circuit may be out of balance due to the ON-resistances of the MOS transistors of the switch-over circuit 2. So, there is a potential problem in that the linearity in the conversion characteristic of the D/A converter may be deteriorated. To obtain the superior linearity in the conversion characteristic of the D/A converter, it is ideal to use MOS transistors whose ON-resistances are negligible. Such a MOS transistor whose ON-resistance is negligible requires a relatively large area in channel width. This limits damages the highly integrated state of the LSI circuit. In addition, high gate capacity of the MOS transistor is required. Such high capacity limits the high-speed performance of the MOS transistor, which acts as a circuit element to switch over the connections.

To obtain a balance of resistance of the R-2R ladder circuit 1, it is preferable that the shunt resistors 2R are designed by giving consideration to the ON-resistances of the MOS transistors in advance. It may be relatively easy to accurately produce a resistance ratio of "1/2" with respect to the R-2R ladder circuit 1 by controlling resistances of the resistor elements only. That is, pattern measurements of the resistor elements are controlled to be "1/2". However, it is difficult to accurately realize a resistance ratio of 1/2 with respect to the circuit elements, containing the resistor elements and MOS transistors, in consideration of the ON-resistances of the MOS transistors.

If dispersion occurs at the operating speeds of the MOS transistors comprising the switch-over circuit 2, the aforementioned D/A converter suffers from another problem. That is, beard-like voltage pulses, called "glitches", occur on an output voltage waveform due to deviations in the switch-over timings.

SUMMARY OF THE INVENTION

It is an object of the invention to provide a digital-to-analog converter which realizes superior linearity in conversion characteristics by setting optimum ON-resistances for the MOS transistors comprising a switch-over circuit.

It is another object of the invention to provide a digital-to-analog converter which is capable of reducing glitches.

A D/A converter of this invention is configured by arranging circuit elements in accordance with bit stages which correspond to the bits of a digital input. The D/A converter is mainly configured by a R-2R ladder circuit and a switch-over circuit. The R-2R ladder circuit consists of series resistors (R) and shunt resistors (2R), which are connected together by at nodes corresponding to the bits of the digital input respectively. The node corresponding to a bit stage of the MSB provides an analog output. The switch-over circuit is configured by a number of MOS transistors. A first group of MOS transistors are connected to the shunt resistors with respect to the bit stages corresponding to the bits of the digital input respectively. The MOS transistors in the first group are respectively driven by the bits in connection with a positive reference potential Vref(+). In addition, MOS transistors in a second group are connected to the shunt resistors with respect to the bit stages respectively. The MOS transistors in the second group are respectively driven by inverted values of the bits in connection with a negative reference potential Vref(−).

A property of the MOS transistor is defined by a ratio W/L which is calculated using a channel width W and a channel length L. The dimensions of the MOS transistors are set such that the ratios W/L are sequentially reduced by a factor of 1/2 in a bit-stage descending order from the bit stage of the MSB to the bit stage of the LSB. Further, dummy gates are provided for the MOS transistors, except the MOS transistors which correspond to the bit stage of the MSB, so that the same gate capacity is set for the MOS transistors with respect to each of the bit stages.

Thus, it is possible to realize superior linearity in the conversion characteristic of the D/A converter while securing a balance of resistance of in the R-2R ladder circuit. Moreover, it is possible to avoid the occurrence of glitches as well because the same channel length is set for the MOS transistors with respect to each bit stage so that a constant switch operating speed is secured with respect to each bit stage.

BRIEF DESCRIPTION OF THE DRAWINGS

These and other objects of the subject invention will become more fully apparent as the following description is read in light of the drawings wherein.

DESCRIPTION OF THE PREFERRED EMBODIMENT

Figure 1:
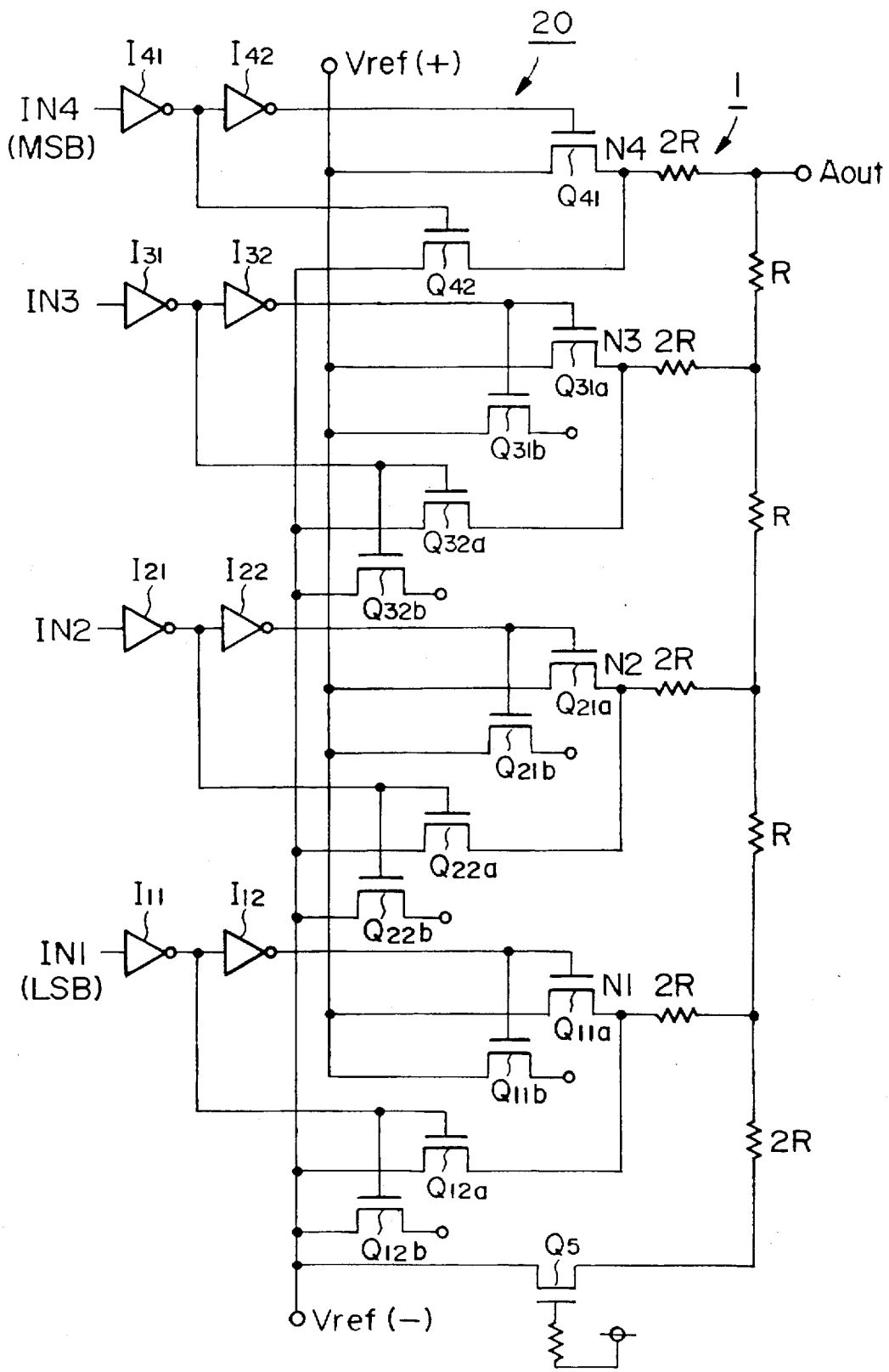
FIG. 1 is a circuit diagram showing a configuration of a D/A converter which is designed in accordance with an embodiment of the invention.
Figure 5:
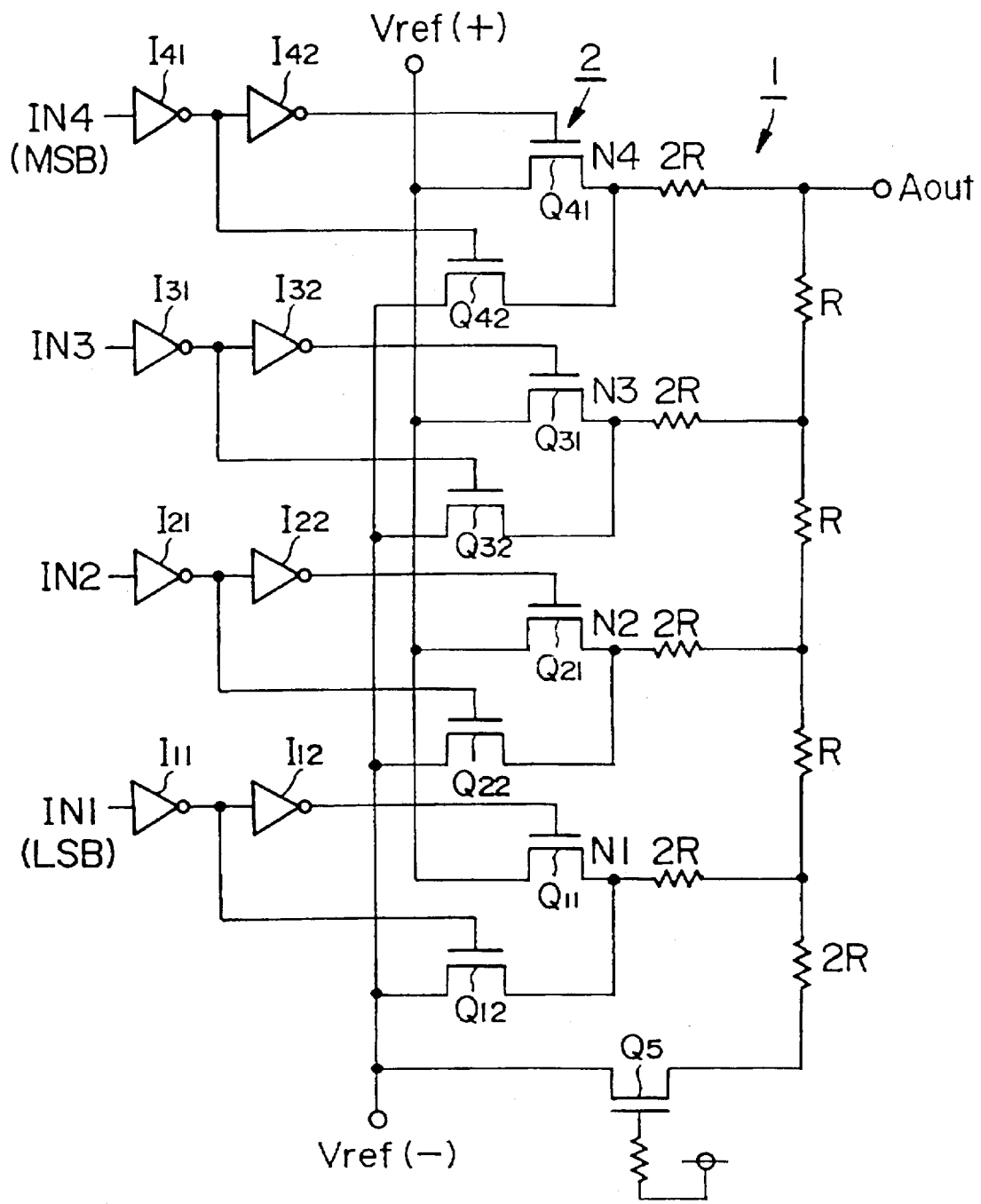
FIG. 5 is a circuit diagram showing an example of a D/A converter which is used as a basis for design of the present embodiment.

FIG. 1 shows an equivalent circuit of a D/A converter which is designed in accordance with an embodiment of the invention and which is provided inside a semiconductor LSI circuit, wherein parts equivalent to those of the aforementioned D/A converter of FIG. 5 are designated by the same numerals; hence, the description thereof will be occasionally omitted. Like the aforementioned D/A converter of FIG. 5, the D/A converter of FIG. 1 is mainly configured by the R-2R ladder circuit 1 and a switch-over circuit 20.

The configuration of the switch-over circuit 20 differs from the configuration of the switch-over circuit 2 shown in FIG. 5. That is, MOS transistors Q41, Q31a, Q21a and Q11a are connected together in connection with the positive potential terminal of the first reference potential Vref(+), whilst MOS transistors Q42, Q32a, Q22a and Q12a are connected together in connection with the negative potential terminal of the second reference potential Vref(−). Herein, each MOS transistor has a ratio W/L where 'W' denotes a channel width and 'L' denotes a channel length. Dimensions of the MOS transistors are set such that the ratios thereof are sequentially reduced by a factor of 1/2 in the direction from the bit stage of the MSB to the bit stage of the LSB. As for the MOS transistors Q41, Q31a, Q21a and Q11a, for example, the ratio of the MOS transistor Q31a is one half of the ratio of the MOS transistor Q41. The same dimensional relationship are set for the MOS transistors Q42, Q32a, Q22a and Q12a.

The switch-over circuit 20 is configured by a number of MOS transistors which are arranged in accordance with bit stages which correspond to IN4 (MSB), IN3, IN2 and IN1 (LSB) respectively. Herein, the dimensions of the MOS transistors of the switch-over circuit 20 differ with respect to each of the bit stages. As for the MOS transistors which are connected to the positive potential terminal of Vref(+), it is necessary to match the effective gate capacities of the MOS transistors Q31a, Q21a and Q11a with the gate capacity of the MOS transistor Q41 which corresponds to the bit stage of the MSB. In order to do so, MOS transistors Q31b, Q21b and Q11b are connected in parallel with the MOS transistors Q31a, Q21a and Q11a respectively. Gates of the MOS transistors Q 31b, Q21b and Q11b are driven commonly with gates of the MOS transistors Q31a, Q21a and Q11a. So, the MOS transistors Q31b, Q21b and Q11b work as dummy gates. Similar circuit design is effected with respect to the MOS transistors connected to the negative potential terminal of Vref(−). That is, MOS transistors Q32b, Q22b and Q12b are connected as dummy gate in parallel with the MOS transistors Q32a, Q22a and Q12a as dummy gates. Thus, the effective gate capacities of the MOS transistors Q32a, Q22a and Q12a are matched with the gate capacity of the MOS transistor Q42 corresponding to the bit stage of the MSB.

Figure 2A:
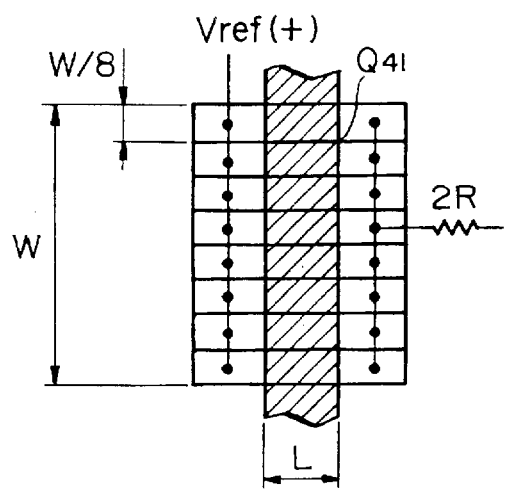
FIGS. 2A, 2B, 2C and 2D are drawings showing element patterns which are formed with respect to some of the MOS transistors shown in FIG. 1.
Figure 2B:
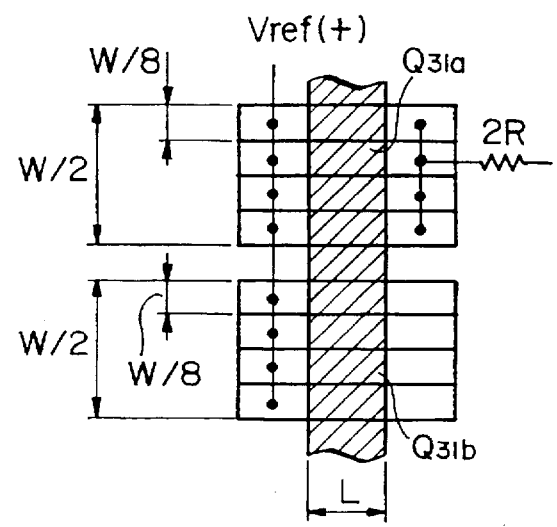
Figure 2C:
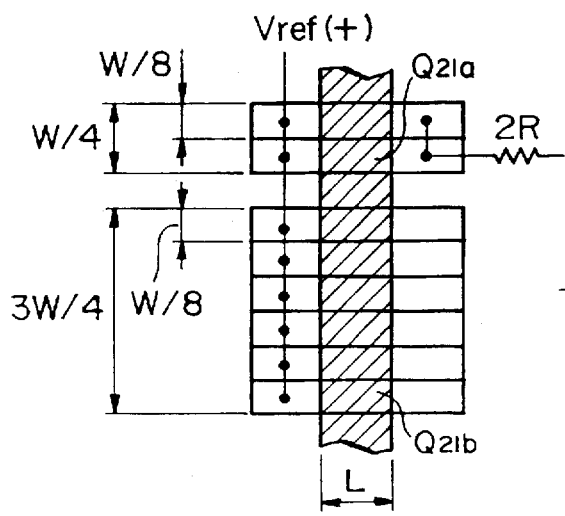
Figure 2D:
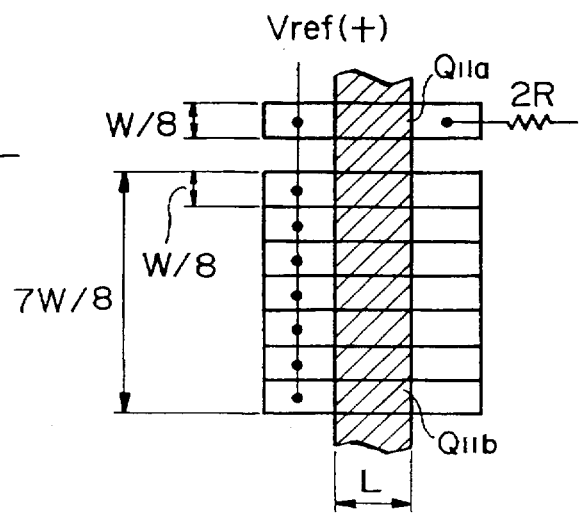

FIGS. 2A to 2D show examples of element patterns which are formed between the MOS transistors connected to the terminal of Vref(+) and the MOS transistors which work as the dummy gates. Namely, FIG. 2A shows element patterns formed for the MOS transistor Q41; FIG. 2B shows element patterns formed between the MOS transistors Q31a and Q31b; FIG. 2C shows element patterns formed between the MOS transistors Q21a and Q21b; and FIG. 2D shows element patterns formed between the MOS transistors Q11a and Q11b. In FIGS. 2A to 2D, the portions (portions hatched with slanted lines) designate gates each having a gate width which is roughly identical to the channel length L. Herein, a constant gate width is set for all of the MOS transistors Q41, Q31a, Q21a and Q11a. In contrast, the channel widths are changed and are sequentially reduced by a factor of 1/2 as the bit stage of the MOS transistor is lowered. Each of the MOS transistors is configured using a number of cell transistors (see the rectangular blocks in FIGS. 2A to 2D) each having an effective channel width of 'W/8'. For example, the MOS transistor Q41 is configured using 8 cell transistors, so that the total channel width thereof is 'W'. The MOS transistor Q31a is configured using 4 cell transistors, so that the total channel width thereof is 'W/2'. The MOS transistor Q21a is configured using 2 cell transistors, so that the total channel width is 'W/4'. The MOS transistor Q11a is configured using a single cell transistor, so that the channel width thereof is 'W/8'. Therefore, the channel widths of the MOS transistors Q31a, Q21a and Q11a are respectively reduced to 1/2, 1/4 and 1/8 of the channel width W of the MOS transistor Q41.

As described before, the gates of the MOS transistors Q31b, Q21b and Q11b, which work as the dummy gates are commonly connected with the gates, of the MOS transistors Q31a, Q21a and Q11a. Herein, the MOS transistor Q31b is configured using 4 cell transistors; the MOS transistor Q21b is configured using 6 cell transistors; and the MOS transistor Q11b is configured using 7 cell transistors. So, the MOS transistors Q31b, Q21b and Q11b have channel widths of W/2, 3W/4 and 7W/8 respectively. Each of the MOS transistors Q31b, Q21b and Q11b which work as the dummy gates has a source and a drain. To obtain stability as load capacity, one of the source and drain of the above MOS transistor is connected to the terminal of Vref(+) whilst the other is opened.

A similar manner of circuit design is used for the MOS transistors connected to the terminal of Vref(−). That is, the MOS transistor Q42 has a channel width of W, so the channel widths of the MOS transistors Q32a, Q22a and Q11a are set at W/2, W/4 and W/8, respectively. In addition, the channel widths of the MOS transistors Q32b, Q22b and Q12b which work as the dummy gates are set at W/2, 3W/4 and 7W/8 respectively. Thus, the above MOS transistors are formed using the aforementioned element patterns shown in FIGS. 2A to 2D as well. Incidentally, the MOS transistor Q5 is formed using the same element pattern as the MOS transistors Q11a and Q12a.

It is well known that the ON-resistance of a MOS transistor is inversely proportional to the ratio W/L. As for the MOS transistors connected to the terminal of Vref(+) in the D/A converter of FIG. 1, the ON-resistances are sequentially increased by a factor of 2 in the order of Q41, Q31a, Q21a and Q11a. As for the MOS transistors connected to the terminal of Vref(−), the ON-resistances are sequentially increased by a factor of 2 in the order of Q42, Q32a, Q22a and Q12a. The above setting of the ON-resistances of the MOS transistors allows the R-2R ladder circuit 1 to achieve a balance of resistance, which provides superior linearity in the conversion characteristic of the D/A converter of the present embodiment. Reasons why the present embodiment is advantageous to yield such superior linearity in the conversion characteristic will be described below in conjunction with FIG. 3 and FIGS. 4A to 4F.

Figure 3:
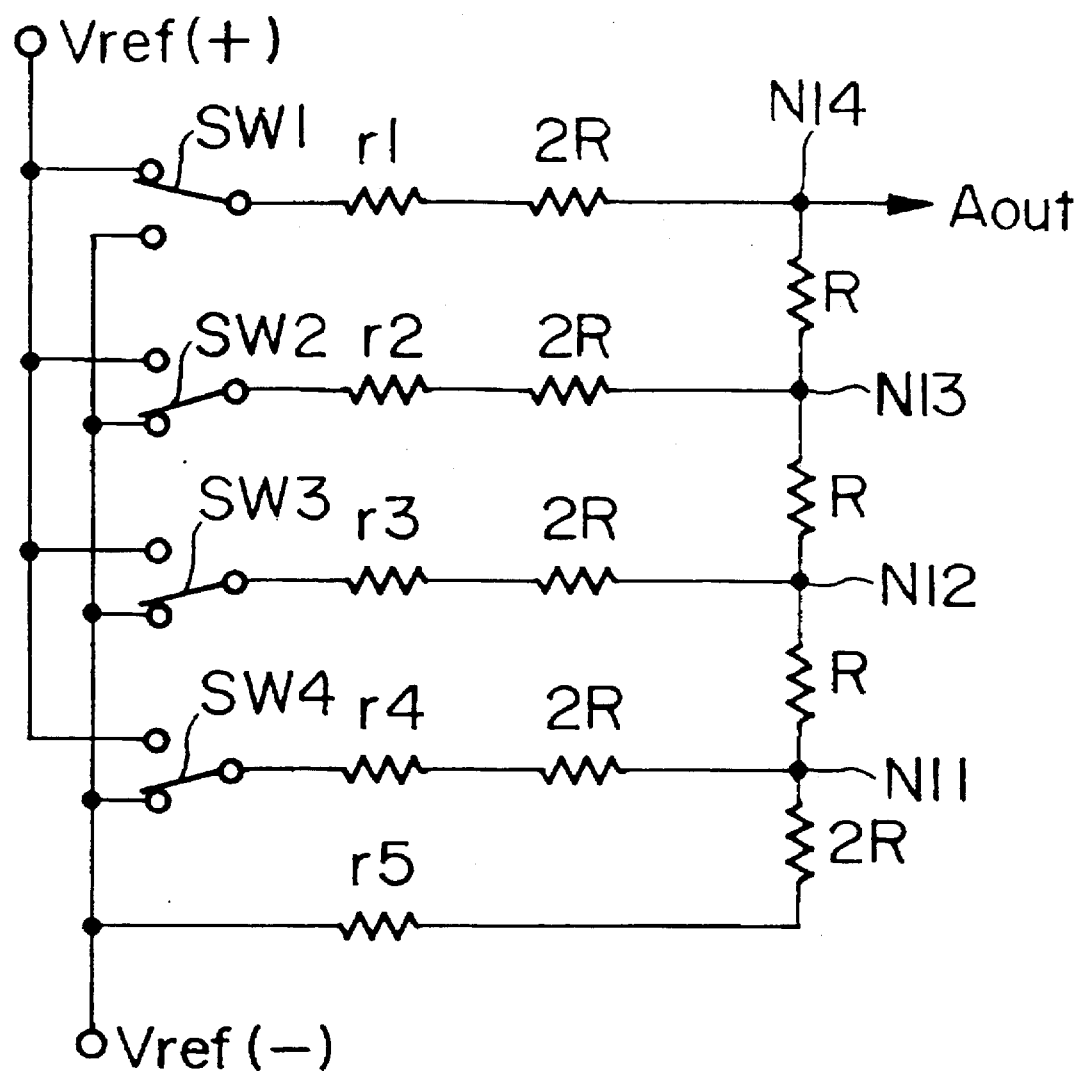
FIG. 3 is a circuit diagram showing an equivalent circuit representing the D/A converter of FIG. 1.

FIG. 3 shows an equivalent circuit simply representing essential parts of the D/A converter shown in FIG. 1. Herein, switches SW1 to SW4 represent the MOS transistors which are connected to the terminals of Vref(+) and Vref(−) in connection with the bit stages. That is, each switch represents the MOS transistors which are provided for each bit stage. In addition, r1 to r4 denote ON-resistances of the MOS transistors which are represented by the switches SW1 to SW4 respectively. Those resistors r1 to r4 are respectively connected between the switches SW1 to SW4 and the shunt resistors 2R. Further, r5 denotes the ON-resistance of the MOS transistor Q5 which is connected between the resistor 2R and the terminal of Vref(−). In FIG. 3, nodes N1 to N14 denote the nodes of the series resistors R which respectively correspond to the bit stages.

Figure 4A:
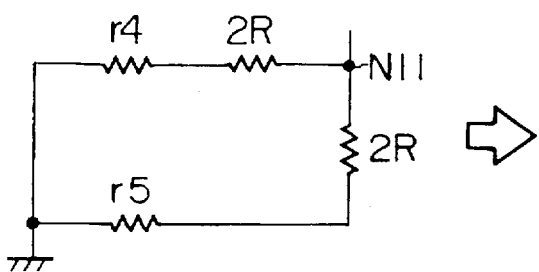
FIGS. 4A, 4B, 4C, 4D, 4E and 4F show equivalent circuits each representing a part of the circuit of FIG. 3.
Figure 4B:
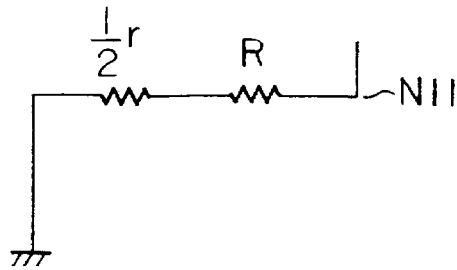
Figure 4C:
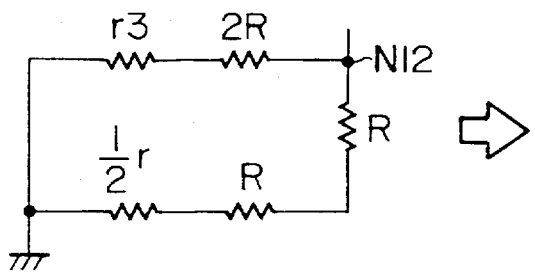
Figure 4D:
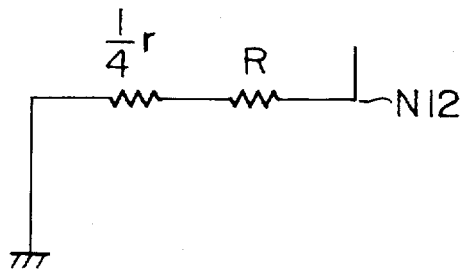
Figure 4E:
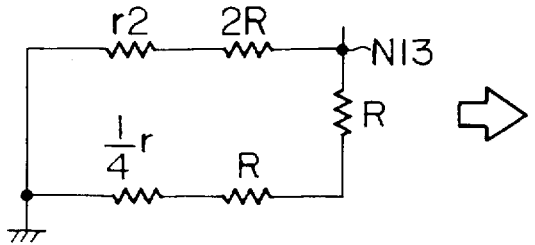
Figure 4F:
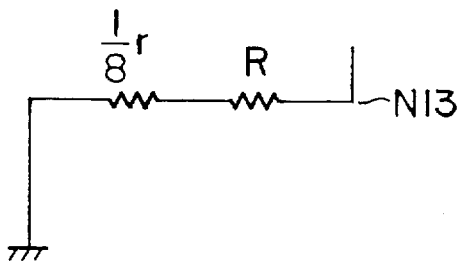

FIG. 4A shows a circuit which is obtained by observing a part of the circuit of FIG. 3 downwardly from the node N11 corresponding to the bit stage of LSB. The circuit of FIG. 4A is a parallel circuit which is formed between ground and the node N11. In order to achieve a current distribution ratio of 1/2 with respect to each line of the parallel circuit, it is necessary to establish the condition that r4=r5=r. When such a condition is established, the circuit of FIG. 4A is equivalent to the circuit of FIG. 4B. Next, FIG. 4C shows a parallel circuit which is obtained by observing a part of the circuit of FIG. 3 downwardly from the node N12. To achieve a current distribution ratio of 1/2 with respect to each line of the parallel circuit, it is necessary to establish the condition that r3=r/2. When such a condition is established, the circuit of FIG. 4C is equivalent to the circuit of FIG. 4D. Similarly, FIG. 4E shows a parallel circuit which is obtained by observing a part of the circuit of FIG. 3 downwardly from the node N13. To achieve a current distribution ratio of 1/2 with respect to each line of the parallel circuit, it is necessary to establish the condition that r2=r/4. When such a condition is established, the circuit of FIG. 4E is equivalent to the circuit of the FIG. 4F.

The aforementioned setting of the measurements of the MOS transistors is represented by a relationship of r5=r4=2r3=4r2=8r1. If such a relationship is established, the resistors of the R-2R ladder circuit 1 deviate from a resistance ratio of 1/2 due to the ON-resistances of the MOS transistors. However, it is possible to establish a balance of resistance to achieve a current distribution ratio of 1/2 with respect to each node of the series resistors R. For example, if a 4-bit binary code of "0100" is input to the D/A converter of the present embodiment, an ideal output voltage Aout is produced correspondingly. This output voltage Aout can be easily calculated from the equivalent circuit as follows:

$$Aout=\{Vref(+)-Vref(-)\}/4$$

As for other binary codes input to the D/A converter, it is possible to produce ideal outputs as well. As a result, it is possible to obtain superior linearity in the conversion characteristic of the D/A converter.

The present embodiment dummy gates with respect to the bit stages (except the bit stage of the MSB); and consequently, the same gate capacity is provided for each bit stage. In addition, the same channel length is set for the MOS transistors belonging to each bit stage. This allows the present embodiment to provide a constant switch operating speed with respect to each bit stage. As a result, it is possible to avoid the occurrence of glitches which would occur when the switch-over circuit 2 operates. Thus, it is possible to obtain a superior output characteristic of the D/A converter.

As this invention may be embodied in several forms without departing from the spirit of essential characteristics thereof, the present embodiment is illustrative and not restrictive, since the scope of the invention is defined by the appended claims rather than by the description preceding them, and all changes that fall within the metes and bounds of the claims, or equivalent to such metes and bounds are therefore intended to be embraced by the claims.

What is claimed is:

1. A digital-to-analog converter comprising:

a R-2R ladder circuit which includes series resistors (R) and shunt resistors (2R); and a switch-over circuit which switches over connections of the R-2R ladder circuit between a first reference potential and a second reference potential with respect to each of bit stages corresponding to bits of a digital input;

wherein the switch-over circuit is configured by a plurality of MOS transistors whose ratios W/L, calculated using a channel width W and a channel length L, are sequentially reduced by a factor of 1/2 in a bit-stage descending order from a bit stage of a most significant bit (MSB) to a bit stage of a least significant bit (LSB), and all of the MOS transistors except the MOS transistors corresponding to the bit stage of the MSB are accompanied with dummy gates which are provided to set same gate capacity with respect to each of the bit stages.

2. A digital-to-analog converter comprising:

a R-2R ladder circuit which includes series resistors (R) and shunt resistors (2R) which are connected together at nodes, a number of which corresponds to a number of input bits constructing a digital input;

a first group of MOS transistors which are connected to the shunt resistors with respect to the nodes respectively and which are driven by the input bits respectively in connection with a first reference potential;

a second group of MOS transistors which are connected to the shunt resistors with respect to the nodes respectively and which are driven by inverted values of the input bits in connection with a second reference potential, dimensions of the MOS transistors being set such that ratios W/L, calculated using a channel width W and a channel length L, are sequentially reduced by a factor of 1/2 in a bit-stage descending order from a bit stage of a most significant bit (MSB) to a bit stage of a least significant bit (LSB); and first and second groups of dummy gate MOS transistors respectively associated with the first and second groups of the MOS transistors connected to the shunt resistors except for the MOS transistors connected to the shunt resistors for the MSB, the dummy gate MOS transistors of the first group each having a gate which is driven by one of the input bits and the dummy gate MOS transistors of the second group each having a gate which is driven by the inverted value of one of the input bits; wherein channels of the MOS transistors of the first and second groups and of the dummy gate MOS transistors each occupy respective element pattern areas, the element pattern areas occupied by the MOS transistors of the bit stage of the MSB being equal to a sum of the element pattern areas occupied by the MOS transistors and associated dummy gate MOS transistors of each of the other bit stages.

3. The digital-to-analog converter according to claim 2 further comprising:

a resistor (2R) which is coupled between the node corresponding to the bit stage of the LSB and the second reference potential; and a MOS transistor which is connected between the resistor (2R) and the second reference potential and which is normally biased in an on state.

4. The digital-to-analog converter according to claim 2 further comprising inverters for providing the inverted values of the input bits of the digital input, and wherein the MOS transistors are each configured from n-channel MOS transistors.

5. A digital to analog converter receiving a plurality of digital input bits ranging from a most significant bit (MSB) to a least significant bit (LSB), the converter comprising:

a R-2R ladder circuit which includes a plurality of series resistors and shunt resistors, there being at least one shunt resistor for each of the digital input bits;

a switching circuit for selectively coupling the shunt resistors to a reference potential in response to the digital input bits, the switching circuit comprising a plurality of MOS switching transistors, there being at least one MOS switching transistor for each of the digital input bits, the MOS switching transistors each being comprised of a number of uniform dimensioned cell transistors, the number of cell transistors comprising the MOS switching transistors being reduced by a factor of 1/2 in bit descending order from the MOS switching transistor for the MSB to the MOS switching transistor for the LSB; and a plurality of dummy gates, there being at least one dummy gate for each of the digital input bits except the MSB, each dummy gate being coupled to the reference potential and a corresponding digital input bit, the dummy gates each being comprised of a number of the cell transistors, the number of cell transistors comprising the dummy gate for a particular digital input bit being equal to the number of cell transistors comprising the switching transistor for the MSB less the number of cell transistors comprising the switching transitors for the particular digital input bit.

6. The digital-to-analog converter of claim 5 wherein there are four digital input bits, the MOS switching transistors for the MSB to LSB are comprised of 8, 4, 2 and 1 cell transistors, respectively, and the dummy gates for the next to most significant bit to the LSB are comprised of 4, 6 and 7 cell transistors, respectively.

7. The digital-to-analog converter of claim 5 wherein an analog output of the converter is taken from a terminal of the shunt resistor for the MSB.

* * * * *